United States Patent [19]

Ovshinsky

[11] Patent Number: 4,713,493
[45] Date of Patent: * Dec. 15, 1987

[54] POWER GENERATING OPTICAL FILTER

[75] Inventor: Stanford R. Ovshinsky, Bloomfield Hills, Mich.

[73] Assignee: Energy Conversion Devices, Inc., Troy, Mich.

[*] Notice: The portion of the term of this patent subsequent to Feb. 10, 2004 has been disclaimed.

[21] Appl. No.: 806,232

[22] Filed: Dec. 6, 1985

Related U.S. Application Data

[63] Continuation-in-part of Ser. No. 786,579, Oct. 11, 1985, Pat. No. 4,642,413.

[51] Int. Cl.$^4$ .................... H01L 31/06; G02B 5/20
[52] U.S. Cl. ........................... 136/249; 350/311; 52/173 R; 136/249; 136/251; 136/257; 136/258; 136/291; 180/65.3; 296/84 R; 296/85
[58] Field of Search ............ 52/173 R; 136/255, 249, 136/256, 251, 257, 258, 259, 260, 261, 262, 263, 264, 265, 290, 291; 296/84 R, 85; 350/311; 180/65.3

[56] References Cited

U.S. PATENT DOCUMENTS

| 4,166,919 | 9/1979 | Carlson | 136/89 |
| 4,400,577 | 8/1983 | Spear | 136/259 |
| 4,598,164 | 7/1986 | Tiedje et al. | 136/249 |
| 4,642,413 | 2/1987 | Ovshinsky | 350/311 X |

FOREIGN PATENT DOCUMENTS

| 3044586 | 5/1982 | Fed. Rep. of Germany | 136/291 |
| 58-50782 | 3/1983 | Japan | 136/251 |
| 58-148471 | 9/1983 | Japan | 136/251 |
| 59-105379 | 6/1984 | Japan | 136/249 TJ |
| 59-115571 | 7/1984 | Japan | 136/291 |

Primary Examiner—Deborah L. Kyle
Assistant Examiner—Brian S. Steinberger
Attorney, Agent, or Firm—Marvin S. Siskind; Richard M. Goldman

[57] ABSTRACT

A power generating optical filter specially tuned to (1) transmit at least portions of selected wavelengths of incident light and (2) generate electrical power from absorbed portions of selected wavelengths of incident light.

7 Claims, 20 Drawing Figures

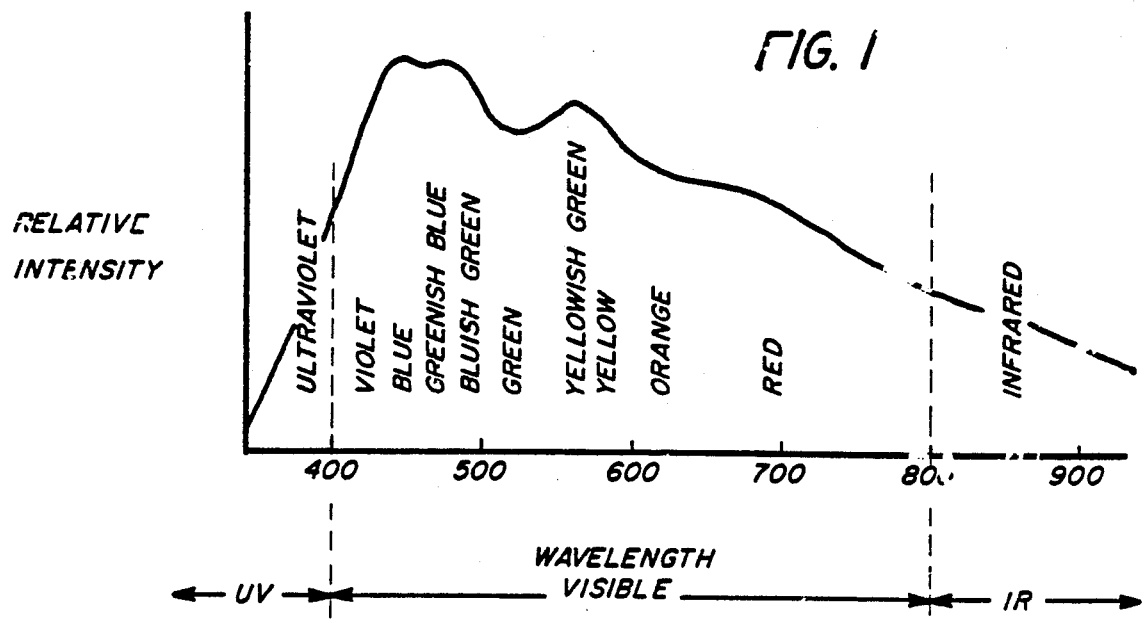
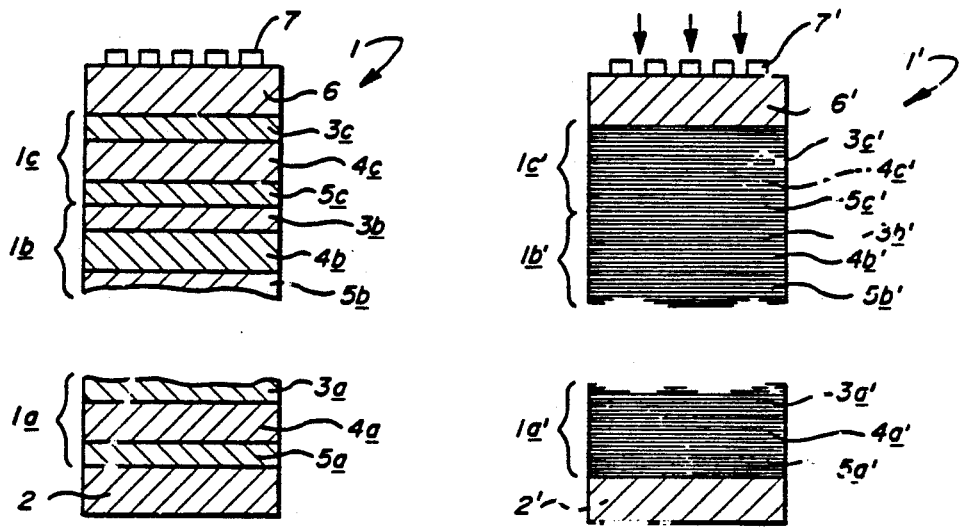
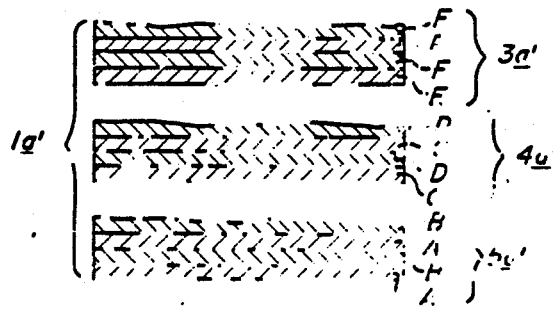
FIG. 1
FIG. 2A
FIG. 2B
FIG. 2C

POWER GENERATING OPTICAL FILTER

This is a continuation-in-part of U.S. patent application Ser. No. 786,579, filed Oct. 11, 1985, also entitled Power Generating Optical Filter now U.S. Pat. No. 4,642,413 issued Feb. 10, 1987.

FIELD OF THE INVENTION

This invention relates generally to optical filters and more particularly, to optical filters adapted to generate electrical power simultaneously with filtering portions of selected wavelengths of light passing therethrough. By adhering to the techniques disclosed by the instant invention, the quantity and spectral quality of light transmitted through an optical filter may be controlled within preselected limits. Additionally, the light absorbed by the filter may be productively employed for the generation of electrical power. The filter of the instant invention may be advantageously utilized to generate power for optical devices such as cameras or the filter may be readily adapted for use with architectural glass panels or vehicular windshields.

BACKGROUND OF THE INVENTION

Optical filters have been widely used for a long period of time to control both the intensity and spectral distribution of light. It is known that ancient civilizations had mastered the techniques of fabricating a variety of colored glasses and that they employed these colored glasses for purposes of blocking undesirable rays of the sun as well as for fabricating aesthetically pleasing objects. Optical filters continued to gain in popularitty through the years as the uses therefor increased. Said filters are presently widely employed in a variety of applications; for example, the photographic and printing arts rely heavily upon the use of optical filters to balance the hue and intensity of light employed in those processes. Optical filters have also gained widespread acceptance in the manufacture of eye glasses for purposes of preventing glare.

Tinted glass may be considered to be one particular type of an optical filter. Tinted glass is currently finding increasingly greater usage as a material from which to fabricate automobile windows and architectural glazing panels insofar as the light transmission qualities thereof may be selected and specifically tailored so as to minimize the passage of heat and glare therethrough, thereby preventing harmful infrared and ultraviolet rays from being transmitted through the glass and into buildings and automobiles.

FIG. 1 is a graphic representation of the solar spectrum showing the relative intensity of solar radiation incident upon the surface of the earth as a function of the wavelength of that radiation. The abscissa of the graph is calibrated in nanometers and depicts a range of wavelengths between approximately 350 to 950 nanometers. Also indicated on the ordinate are those regions of the electromagnetic spectrum commonly denominated as ultraviolet, visible and infrared wavelengths. The exact boundaries between these various regions of the spectrum are somewhat subjective; however, for purposes of discussion herein the ultraviolet region shall be considered to be wavelengths shorter than about 400 nanometers and the infrared region shall be considered to be those wavelengths longer than about 800 nanometers with the visible portion of the spectrum spanning the range of 400–800 nanometers.

The graph of FIG. 1 also indicates the color perceived by the eye for various ranges of wavelengths of the spectrum; for example, wavelengths of approximately 450 nanometers are generally perceived as blue, wavelengths of approximately 525 nanometers appear green and wavelengths in the vicinity of 700 nanometers are generally seen as red. It will be noted that the relative intensity of the solar spectrum varies as a function of wavelength, this variation being due to the characteristic output spectrum of the sun as well as atmospheric filtering effects.

Although well known, it will be helpful for the purpose of understanding the discussion which follows that the energy associated with a particular photon will vary in inverse proportion to that photon's wavelength and may be determined by multiplying its frequency by Planck's constant. For example, photons of a wavelength of 400 nanometers have an energy of approximately 3.10 electron volts whereas photons of a wavelength of 800 nanometers have an energy of approximately 1.55 electron volts. Accordingly, it may be seen that ultraviolet photons, even those in the near ultraviolet region of 400 nanometers are quite energetic. Furthermore, and as can also be gleaned from FIG. 1, the relative intensity of these 400 nanometer photons is fairly high. For this reason it is not surprising that solar radiation can cause damage to a variety of materials, such as the interiors of automotive vehicles and buildings, as well as to human tissues such as retinas and skin. Accordingly, one object of using light filters is to eliminate the harmful ultraviolet wavelengths of the solar spectrum.

Since ultraviolet photons have sufficient energy (as shown hereinabove) to break many chemical bonds, particularly covalent bonds; it is not at all surprising that many materials are damaged by ultraviolet radiation. For example, paints, plastics or other organic materials are readily degraded by ultraviolet radiation, this degradation being manifested by yellowing, embrittlement or outright decomposition of such materials. For this reason, ultraviolet screening agents are frequently included in paint and plastics so as to prevent significant penetration of ultraviolet radiation therethrough. In other instances, as for example in display windows and the like, ultraviolet absorbing screens or filters are employed to prevent damage to the displayed goods. In addition to damaging goods, ultraviolet rays have been identified as being destructive to human tissue, particularly as causing of skin cancer and retina damage in humans. Therefore, it has been found desirable to limit exposure to such harmful radiation as by the inclusion of ultraviolet filters in architectural glazing panels, automobile and airplane windows and the like.

It is frequently desirable to also filter out the infrared wavelengths of the solar spectrum. Although infrared photons are of relatively low energy and therefore unable to break many chemical bonds, they are of a wavelength particularly well adapted to induce molecular vibrations, thereby heating materials upon which they impinge. In some instances, such as in greenhouses and solar collectors for example, it is desirable to maximize the transmission of infrared radiation so that said radiation may be absorbed in a medium for the production of heat. However, in other instances it is desirable to prevent or at least reduce the transmission of infrared radiation so as to, for example, lessen the burden on air conditioning systems.

It may thus be seen that it is necessary to utilize optical filtering mechanisms in order to limit the passage of harmful and/or unwanted solar radiation into particular areas. Furthermore, and as should be obvious from the FIG. 1 depiction of the various colors of the visible wavelengths of the solar spectrum, transmission of preselected wavelengths for aesthetic and/or practical reasons may be maximized by using an optical filter to judiciously absorb, reflect or transmit portions of incident radiation.

Optical filters typically operate by either absorbing or reflecting portions of light incident thereupon. In absorption-type filters, chromophoric materials such as dyes, metal ions and the like are adapted to absorb selected energies of incident light. By judicious design of a chromophoric material, the wavelength of the transmitted light may be selected, and by judicious selection of the concentration of chromophoric material, the intensity of the transmitted light may be selected.

Reflection filters typically operate on the principle of constructive interference. In such reflection filters, layers of the appropriate materials, having thicknesses which are precise multiples of preselected wavelengths of light, interact with rays of those preselected wavelengths to either facilitate the transmission or reflection of those particular wavelengths. By exercising appropriate control of the thickness and materials from which these layers are fabricated, the transmission characteristics of the filter may be rather precisely controlled.

Heretofore, the light which was not transmitted by prior art optical filters was effectively wasted. In absorption type filters, the chromophoric material absorbs incident photons from the solar spectrum and therefore becomes warm. This warming effect is at the very least wasteful of incident light energy and in some cases is actually detrimental or damaging to the operation of the filter. For example, many buildings and automobiles employ tinted glass optical filters for purposes of maintaining a lowered ambient temperature therewithin. In such instances, heating of the tinted glass which results from the absorption of incident photons is counterproductive insofar as that heat is at least partially radiated into the enclosed environment. In other instances, the absorption of light by the chromophoric material causes degradation of that material, which degradation is manifested by a change in optical properties of the material. In some cases the build up of heat in a light absorbing optical filter may be so severe as to melt, crack or otherwise deform the filter, thereby rendering it useless. While the problem of heat buildup is obviously not significant in interference-type filters insofar as such filters reflect, rather than absorb, radiation which is not transmitted therethrough; the reflected light is effectively wasted and can go so far as to actually constitute a nuisance, as for example, when the light is reflected from one building onto adjoining property.

As should be obvious from the foregoing discussion, optical filters have gained widespread popularity and importance, particularly as glazing materials for automobile windshields and architectural structures. This popularity and utility stems from the fact that said filters provide mankind with control of the ambient flux of light of aesthetic and/or energy conservation purposes. Furthermore, it should be apparent that prior art optical filters suffered from shortcomings because, as detailed hereinabove, the light which is not transmitted through heretofore available optical filters oftentimes either damaged those filters or presented a nuisance to adjoining property.

On a different, but interrelated subject; due to the fact that there is an increasing world demand being placed upon ever dwindling non-renewable resources, energy prices are now at a premium. New sources of energy and new methods of energy conservation are being eagerly sought. Glass covered portions of buildings, particularly modern high rise buildings, and automotive windshields present relatively large areas which are exposed to incident solar radiation. Prior to the subject invention, this radiation was effectively wasted, at times detrimentally, by heretofore available optical filter materials. It would clearly be of great advantage to effectively use this "waste light" for purposes of productive power generation.

Photovoltaic devices have enjoyed increasingly greater use for the generation of power insofar as they are inherently non-polluting, silent and consume no expendable natural resources in their operation. However, until recently, photovoltaic devices were fabricated from single crystal materials which severly limited the utility of such devices insofar as crystalline materials are difficult to produce in large areas are relatively thick, fragile and heavy and are expensive and time consuming to fabricate.

Recently, considerable efforts have been made to develop processes for depositing thin film semiconductor materials which can encompass relatively large areas which can be readily doped to form p-type and n-type as well as intrinsic materials for the production of photovoltaic devices substantially equivalent to those produced by crystalline materials. Among such thin film materials are amorphous materials and it is to be noted that the term "amorphous" as used herein, includes all materials or alloys which have long range disorder, although they might have short or intermediate order or even contain, at times, crystalline inclusions.

It is now possible to prepare by glow discharge or other vapor deposition techniques, thin film amorphous silicon or germanium based alloys in large areas, said alloys possessing acceptable concentrations of localized states in the energy gaps thereof and high quality electronic properties. Suitable techniques for the fabrication of such materials are fully described in U.S. Pat. No. 4,226,898, entitled "Amorphous Semiconductor Equivalent to Crystalline Semiconductors," of Stanford R. Ovshinsky and Arun Madan which issued Oct. 7, 1980 and in U.S. Pat. No. 4,217,374 under the same title which issued on Aug. 12, 1980, to Stanford R. Ovshinsky and Masatsugu Izu and in U.S. Pat. No. 4,504,518 of Stanford R. Ovshinsky, David D. Allred, Lee Walter and Steven J. Hudgens entitled "Method of Making Amorphous Semiconductor Alloys and Devices Utilizing Microwave Energy," which issued on Mar. 12, 1985, and in U.S. Pat. No. 4,517,223 under the same title which issued on May 14, 1985 to Stanford R. Ovshinsky, David D. Allred, Lee Walter and Steven J. Hudgens, the disclosures of which are incorporated herein by reference. As disclosed in these patents, it is believed that fluorine introduced into the amorphous semiconductor operates to substantially reduce the localized states therein and facilitates the addition of other alloying and/or dopant materials.

Unlike crystalline silicon, amorphous silicon and germanium alloys can be deposited in multiple layers over large area substrates to form semiconductor devices such as solar cells in a high volume, continuous processing system. Such continuous processing systems are disclosed in the following U.S. Pat. Nos.: No. 4,400,409, for "A Method of Making P-Doped Silicon Films and Devices Made Therefrom," U.S. Pat. No. 4,410,588, for "Continuous Amorphous Solar Cell Deposition and Isolation System And Method," U.S. Pat. No. 4,542,711 for "Continuous Systems For Depositing Amorphous Semiconductor Material" U.S. Pat. No. 4,492,181 for "Method And Apparatus For Continuously Producing Tandem Amorphous Photovoltaic Cell" and U.S. Pat. No. 4,485,125 for "Method And Apparatus For Continuously Producing Tandem Amorphous Photovoltaic Cells". As disclosed in these patents, the disclosures of which are incorporated herein by reference, a substrate may be continuously advanced for deposition of semiconductor layers thereonto through a succession of deposition chambers, wherein each chamber is dedicated to the deposition of a specific semiconductor material. For example, in making a solar cell of n-i-p type configuration, a first chamber is dedicated to depositing an n-type amorphous silicon alloy, the second chamber is dedicated to depositing an intrinsic amorphous silicon alloy, and the third chamber is dedicated for depositing a p-type amorphous silicon alloy.

The layers of the semiconductor material thus deposited in the vacuum envelope of the deposition apparatus may be utilized to form a photovoltaic device including one or more p-i-n cells, or one or more n-i-p cells, a Schottky barrier, as well as other semiconductor devices. Additionally, by making multiple passes through the deposition chambers, or by providing an additional array of deposition chambers, multiple stacked photovoltaic cells, or photovoltaic cells having component layers fabricated from a large number of stacked thin film layers, may be obtained.

It may thus be seen that thin film photovoltaic technology has now matured to a point where large area, high efficiency photovoltaic cells may be readily and economically manufactured. Thin film photovoltaic materials are ideally suited for use in fabricating optical filters which have been specially tailored so as to generate power from the energy present in that non-transmitted portion of the incident solar spectrum referred to hereinabove as "waste light". Thin film semiconductor alloy materials may be readily deposited in large areas upon a wide variety of conventionally and unconventionally configured substrates. Additionally, the optical absorption, band gap, transmittance and other physical properties of said thin film semiconductor alloy materials may be readily controlled by the techniques described in the patents incorporated herein by reference so as to provide a thin film photovoltaic body having desirable light absorption and transmission characteristics. Furthermore, by utilizing the deposition techniques referred to herein, structures comprised of a multiplicity of thin film layers of preselected wavelengths may be fabricated so as to enhance the optical absorption and/or transmission of those materials for various portions of the solar spectrum. For these reasons, it should now be apparent that optical filters may be fabricated by utilizing thin film semiconductor methods and techniques referred to herein, which filters (1) exhibit a desirable, preselected optical transmission and/or absorption and (2) effectively utilize a portion of preselected wavelengths of the non-transmitted light for the productive generation of electrical power.

Because of the inherent limitations of single crystalline materials, it is impossible to fabricate power generating optical filters therefrom. More particularly, single crystal materials are limited in size by the inherent difficulty of fabricating a perfect crystal and for this reason cannot be readily utilized in large area applications (such as architectural glass). Secondly, single crystal materials are relatively thick and brittle and therefore cannot be processed in thicknesses which would allow for significant light transmission therethrough; nor may they be made to conform to irregularly shaped surfaces (such as automotive windshields). And thirdly, single crystalline materials are fixed in composition and stoichiometry and therefore cannot have their optical properties modified so as to provide optical transmission of preselected wavelengths of incident radiation.

According to the principles disclosed herein large area, optical filters having preselected transparencies to various wavelengths of the incident solar spectrum may be readily fabricated by the use of a plurality of layers formed of thin film semiconductor alloy materials so as to provide the dual function of light filtration and power generation. Such filters have wide utility in the manufacture of architectural glazing panels, automotive windshields, optical filter elements such as lenses, and the like.

These and other advantages of the instant invention will be readily apparent from the brief description, the drawings and the description of the drawings which follow.

BRIEF SUMMARY OF THE INVENTION

There is disclosed herein a power generating optical filter, which filter is at least partially transparent to selected wavelengths of the solar spectrum. The filter includes a transparent substrate, a first substantially transparent electrode disposed upon at least designated areas of the substrate, a body of photovoltaic material having a first surface disposed in electrical communication with the first electrode and a second substantially transparent electrode in electrical communication with the second surface of the body of photovoltaic material. The photovoltaic body is adapted to (1) generate a flow of electrical current in response to the absorption of at least a portion of selected wavelengths of the solar spectrum and (2) transmit at least a portion of selected wavelengths of said solar spectrum. The photovoltaic body and electrodes may be specifically tailored to transmit at least a portion of visible wavelengths of the solar spectrum such as wavelengths between 400 and 800 nanometers in length by the inclusion of band gap adjusting elements therein. The transmission of these wavelengths may be substantially uniform over a significant portion of the visible solar spectrum or the transmission of wavelengths may vary over a significant portion of the visible solar spectrum.

Additionally, the photovoltaic body and electrodes may be tailored to exhibit an absorption edge at a preselected wavelength of the visible solar spectrum for the transmission of light of a desired color. In a particularly useful embodiment, the electrodes and the photovoltaic body may be tuned to cooperate for substantially preventing the transmission of ultraviolet wavelengths of the solar spectrum. In other embodiments, the filter may include one or more optical tuning layers in addition to the electrode and photovoltaic layers for purposes of adjusting the absorption and transmission of the filter.

The substrate upon which the semiconductor material is deposited may be planar or non planar. The first electrode may be coextensive with substantially all of the substrate or may cover just a portion thereof. Likewise the photovoltaic body may be deposited so as to be coextensive with substantially all of the first electrode or it may be deposited so as to cover portions of the first electrode. The filter has particular utility for use as: a windshield for a motorized vehicle, in which case the power generated by the photovoltaic body thereof could be adapted to operate an electrical component of the vehicle; a window for an architectural building, in which case the power generated by the photovoltaic body thereof could be adapted to operate an electrical appliance associated with the building; or the lens of a camera, in which case the power generated by the photovoltaic body thereof could be adapted to operate the electrical circuitry associated with the camera.

In most preferred embodiments, the filter may further include a substantially transparent encapsulating layer protectively disposed on the exposed surface of the second electrode. The encapsulating layer is formed of a material selected from a group consisting essentially of glasses, synthetic polymeric resins, adhesives, wide band gap semiconductors or combinations thereof. In one preferred embodiment, the encapsulating layer may include a synthetic polymeric resin which is adhesively secured to the exposed surface of the second electrode. In another preferred embodiment, the transparent encapsulating layer may be spacedly positioned proximate the exposed surface of the second electrode. In yet a further embodiment, in which one of said encapsulating layer and said substrate is made of a material susceptible to damage from ultraviolet radiation, the electrodes and the photovoltaic body (which electrodes and body are turned to absorb said ultraviolet radiation) may be disposed between (1) the incident solar sepctrum and (2) the damageable one of said encapsulating layer and substrate.

In many preferred embodiments, the electrodes and photovoltaic body will be tuned to cooperate to substantially prevent the transmission of harmful ultraviolet wavelengths of the incident solar spectrum. The substrate is preferably formed from a material selected from the group consisting essentially of glasses, synthetic polymeric resins, or combinations thereof. Where large area substrates are employed, an electrically conductive bus-grid pattern may be placed in electrical contact with one of said electrodes for the more efficient withdrawal of photogenerated current. In some preferred embodiments, the substrate may be translucent. In other preferred embodiments, an external generator may be provided for transmitting electrical current to at least a portion of the filter for resistively heating that substrate.

The photovoltaic body of the filter preferably includes at least one layer of a silicon alloy material including silicon carbon alloys and silicon nitrogen alloys or a germanium alloy material. In a still further preferred embodiment, the photovoltaic body will be fabricated as at least one triad of layers which comprise of two layers of oppositely doped semiconductor material having a layer of substantially intrinsic semiconductor material interposed therebetween. In yet another embodiment, the photovoltaic body includes a plurality of said triads in superposed, electrical and optical series relationship. In the case where the plurality of triads are superposed, a transparent electrically conductive layer is ohmically disposed between each of said adjacent triads. The intrinsic layers of at least two of the triads may be fashioned so as to have band gaps optimized to absorb different wavelengths of the solar spectrum. In still another preferred embodiment, at least one of the triads of the semiconductor layers is formed as a multi-layered sandwich which includes sub-layers of substantially near-atomic thicknesses. In all instances, the first and second electrodes are formed of a material selected from the group consisting essentially of indium oxide, tin oxide, indium tin oxide, zinc oxide, cadmium stannite and combinations thereof.

In an important embodiment, the filter may further be equipped with a body for modifying the transmission characteristics of the filter. In some instances this additional body will absorb a portion of the incident spectrum, whereas in other instances it will reflect a portion of the spectrum. In this manner, the optical properties of the filter may be further modified to reject infra-red or other portions of the solar spectrum.

BRIEF DESCRIPTION OF THE DRAWINGS

FIG. 1 is a graph having relative intensity plotted on the ordinate and wavelength on the abscissa, said graph illustrating the normalized intensity of wavelengths of the solar spectrum and including the colors formed by each region of wavelengths;

FIG. 2A is a fragmentary, cross-sectional view of a tandem photovoltaic device comprising a plurality of stacked n-i-p solar cells, each cell formed from a triad of layers of semiconductor alloy material;

FIG. 2B is a fragmentary, cross-sectional view of the tandem photovoltaic device of FIG. 1A constructed so that each n, i or p conductivity region of each cell is formed by a plurality of disordered layers;

FIG. 2C is a greatly enlarged, fragmentary, cross-sectional view of cell 1c of the tandem photovoltaic device of FIG. 2B illustrating the alternately repeating disordered layers of each conductivity region thereof;

DETAILED DESCRIPTION OF THE DRAWINGS

I. The Photovoltaic Body

Figure 3A:
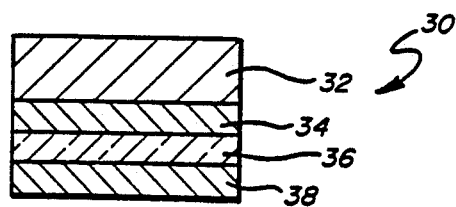
FIG. 3A is an enlarged, cross-sectional view of a first embodiment of the power generating optical filter of the instant invention, said filter formed of a 1.75 eV photovoltaic body disposed between a pair of transparent electrodes.

Referring now to the drawings and particularly to FIG. 2A, a photovoltaic cell, formed of a plurality of successive p-i-n conductivity (layers) regions, each region of which preferably includes an amorphous semiconductor alloy, is shown generally by the reference numeral 1.

More particularly, FIG. 2 shows a p-i-n type photovoltaic device such as a solar cell made up of individual p-i-n type cells 1a, 1b, and 1c. Below the lowermost cell 1a is a substrate 2 which in the content of the instant invention will be transparent and formed of such materials as glasses or synthetic polymeric resins. Although certain applications may require the deposition of a thin oxide region and/or a series of base contacts prior to application of the amorphous material, for purposes of this application, the term "substrate" shall include not only a rigid or flexible member, but also any elements added thereto by preliminary processing. Further, as used herein, the term "disordered" is intended to include all non-crystalline materials, whether amorphous, microcrystalline, polycrystalline or combinations thereof. The important parameter in each of the disordered materials is the existence of long range disorder, although there may be some short range order. Also included within the scope of the present invention are substrates formed of glass, a polyimide material or a polyester material upon which an electrically conductive electrode is subsequently applied.

Each of the cells 1a, 1b and 1c is preferably fabricated with an amorphous or microcrystalline photovoltaic body containing at least a silicon alloy. Each of the semiconductor bodies includes a p-type conductivity region 3a, 3b and 3c; a substantially intrinsic conductivity region 4a, 4b and 4c; and an n-type conductivity region 5a, 5b and 5c. As illustrated, cell 1b is an intermediate cell and, as indicated in FIG. 1A, additional intermediate cells may be stacked atop the illustrated cells without departing from the spirit or scope of the present invention. Also, although p-i-n cells are illustrated, the power generating optical filter of the instant invention may also be fabricated from single or multiple n-i-p cells, p-n junctions, Schottky barrier devices, etc.

It is to be understood that following the deposition of the semiconductor alloy regions, a further deposition process may be either performed in a separate environment or as a part of a continuous process. In this step, a TCO (transparent conductive oxide) region 6 is deposited upon the top cell 1c. An electrode grid 7 may be added to the device where the cell is of a sufficiently large area, or if the conductivity of the TCO layer 6 is insufficient. The grid 7 shortens the carrier path and increases the conduction efficiency.

Referring now to FIG. 2B, the photovoltaic cell 1 of FIG. 2A will be described as it is modified according to multilayering principles. The disordered semiconducting multilayered photovoltaic cell structure 1' of FIG. 2B includes a substrate 2' identical to the substrate 2 of the FIG. 2A cell and onto which individual p-i-n type cells 1a', 1b' and 1c' are successively deposited. Each of the cells includes a p-type conductivity region 3a', 3b', and 3c'; an intrinsic conductivity region 4a', 4b', and 4c', and an n-type conductivity region 5a', 5b', and 5c'. A TCO region 6' is deposited upon the top cell 1c' and an electric grid 7' may be added atop the TCO layer 6'.

Turning to FIG. 2C, an enlarged view of the an exemplary one of the photovoltaic cells of FIG. 1B is shown. As previously stated, cell 1a' includes the p-type conductivity region 3a', the intrinsic conductivity region 4a' and the p-type conductivity region 5a'. However, unlike the cell 1a of FIG. 2A, each of the conductivity regions of cell 1a' includes sets of alternately repeating, 10-30 Å (in the preferred embodiment) thick layers. More particularly, the n-region 5a' includes a set of layers formed of material A and material B which alternately repeat until the n-region has been completed. For instance, layer A may be formed of n-doped amorphous silicon-nitrogen having a first band gap, and layer B may be formed of n-doped amorphous silicon-hydrogen having a second band gap differing from the band gap of layer A. Likewise, the intrinsic region 4a' includes a set of layers formed of material C and material D which alternately repeat until the intrinsic region has been completed. And finally, the p-doped region 3a' includes a set of layers formed of material E and material F which alternately repeat until the p-doped region has been completed. It should be apparent that the other individual cells 1b' and 1c' are to be fabricated in a similar manner so that each region of differing conductivity of each cell is formed from a set of alternately repeating layers formed of differing band gap material. The band gap, the conductivity-type, the optical characteristics or the polarity and magnitdue of fixed charge capability of each of the alternately repeating layers must differ so as to provide potential wells in which, according to superlattice theory, charge carriers may be trapped and separated. The layers can be formed in a periodic or nonperiodic sequence and of a proximity and type which can be controlled to obtain specific properties. The different layers can be sharply separated from one another, can be substantially continuously modulated, or can be continuously modulated structures. The properties of the layers can be coupled or decoupled from one another as well as from the constraints implied by either crystalline ordered or disordered structures. When periodic layer structures are formed, sharp band edges can be introduced, as indicated by calculations based on, for instance, the Kronig-Penny or Mathieu models, despite the lack of long range order within each layers. The structures are freed from the constraints of total periodicity and can be thought of as a linking of periodic type functions to achieve particular goals.

Returning to FIG. 2B, and as illustrated therein, light rays 8 are directed into the tandem photovoltaic cell 1' through the upper p-doped region 3c' of uppermost cell 1c'. The rays next pass through the intrinsic region 4c' and the n-doped region 5c'. The light rays 8 then travel through the conductivity regions of cells 1b' and 1c' and the energy therefrom is converted into electrical energy. Note that for a single cell, i.e., cell 1a' taken alone, a band gap of 1.5 eV theoretically provides the most efficient conversion of light energy impinging thereon into electric energy.

The d-doped window region can be fabricated of multilayer material, as in FIG. 2C, by utilizing alternately repeating layers E and F of approximately up to 30 Å thickness. Layer F can be formed of a silicon-hydrogen and/or fluorine alloy with the addition of a p-dopant such as boron. Layer E will include all the materials used to fabricate layer F as well as nitrogen, carbon or other band gap adjusting element(s), to differentiate the band gap of the alternately repeating layers. (Note that the terms "band gap adjusting element" will be used herein to refer to an element added to the semiconductor material to either increase or decrease the band gap thereof.)

At least one of the alternately repeating layers of the intrinsic region of a cell can be formed of a silicon-fluorine-hydrogen and/or germanium-fluorine-hydrogen alloy and the other of the alternately repeating layers can be formed of the same elements, and in addition, tin or germanium. By so forming the intrinsic region, the band gap thereof is decreased so as to match the solar spectrum more effectively. In addition, the band gap edges can be more sharply defined. This will result in a solar cell having higher short circuit current, higher open circuit voltage, and an improved fill factor, i.e., improved efficiency.

Yet a further disordered semiconducting structure which can be fabricated pursuant to the multilayered concepts disclosed herein is a p-n junction, a structure including alternately repeating p-doped and n-doped layers, i.e., p-n-p-n. In fabricating these structures, the p-layers and n-layers can be independently controlled, so that the best p-layer can be alternated with the best n-layer. The multilayered structures so produced have long excess carrier and photocarrier lifetimes, high mobility, and improved photoconductivity. This may occur because the internal electric fields between the n-layers and p-layers separate the photo-excited electrons and holes. The holes and electrons may then be trapped and spatially separated in the multilayer structures, thereby greatly reducing the recombination probability thereof.

The photovoltaic cells 1, of FIGS. 2A-2C, have been generally described as continuous, large-area cells. It is known to those skilled in the photovoltaic art that such large-area cells may be divided into a plurality of electrically isolated segments adapted for interconnection, so as to provide an interconnected array of segments or sub-cells. For example, a large-area cell may be configured as a plurality of series interconnected segments, so as to provide an output voltage in excess of that of the large-area cell. Similarly, parallel and mixed series-parallel configurations may be established.

Such techniques of cell subdivision and interconnection are known to, and within the skill of, routineers in the field. In the fabrication of the filters of the instant invention, the photovoltaic body may either be a single large area cell, or an interconnected array of smaller area segments.

II. The Optical Filter

Referring now to FIG. 3A, there is depicted a schematic cross-sectional view of one particular embodiment of an optical filter constructed in accordance with the principles of the instant invention and designated generally by the reference numeral 30. The filter 30 includes a substrate 32 which is relatively transparent to light, a first substantially transparent electrode 34 disposed on the substrate, a body of photovoltaic material 36 having a first surface disposed so as to electrically communicate with the first electrode 34 and a second electrode 38 disposed on and electrically communicating with the second surface of the body of photovoltaic material 36.

The substrate 32 serves to support and rigidify the optical filter 30 and is preferably made from a material having a high degree of transparency so that it contributes little, if any, to the optical properties of the filter. Among some of the materials which may be employed for fabricating the substrate 32 are glasses, such as silicate and borosilicate glasses, synthetic polymeric resins such as polyesters, polyimides, polycarbonates, acetates, vinyls and so forth. In some instances, the substrate 32 may be configured as a composite of one or more laminated layers. While in most instances it is preferred that the transparent substrate 32 be optically clear, that is to say, be capable of transmitting light rays directly therethrough, in other instances, for reasons of privacy and the like, the substrate 30 will preferably be made of a translucent material, i.e. a transparent material which scatters incident light passing therethrough.

The light filtering and power generating functions of the optical filter 30 of the instant invention are accomplished by the body of photovoltaic material 36. The photovoltaic material 36 is a thin film semiconductor alloy material which is adapted to absorb at least a portion of the wavelengths of light incident thereupon and generate a flow of electrical current in a photoactive region thereof in response thereto. A wide variety of photovoltaic materials, disposed in various configurations, may be employed in the practice of the instant invention. The photovoltaic body 36 may, for example be an array of p-i-n or n-i-p type photovoltaic cells such as cells 1a, 1b, 1c described with reference to FIG. 2A; similarly the photovoltaic body 36 may comprise a stacked array of said p-i-n or n-i-p type triads in superposed, electrical and optical series relationship. In other instances, the photovoltaic body 36 may include one or more layers formed as a multilayered sandwich including therein sub-layers of substantially near atomic thickness (as illustrated with reference to FIG. 2B and FIG. 2C). In still other instances, the photovoltaic body may be of p-n configuration, or may be a Schottky barrier or M-I-S device.

The body of photovoltaic material 36 has associated therewith two electrodes 34 and 38 operatively disposed in electrical contact so as to allow for the withdrawal of electrical current generated within the photovoltaic body 36. The electrodes 34 and 38 are both preferably formed of a substantially transparent, electrically conductive material so as to maximize the productive absorption of light in the photovoltaic body 36. There are a wide variety of transparent, electrically conductive materials known and available to those skilled in the art. Among such materials are indium oxide, tin oxide, indium tin oxide, zinc oxide, cadmium stannate and various mixtures thereof.

In some instances, and as discussed hereinabove, either one or both of the transparent electrodes 34, 38 may have associated therewith an electrically conductive bus-grid pattern for assisting in the collection of photogenerated current. Bus-grid patterns are well known to those skilled in the art and may be similar to the bus-grid patterns 7 and 7' discussed with reference to FIGS. 2A and 2B, respectively. It should be noted that such bus-grid patterns are generally formed of highly conductive material, such as metals, and for that matter are not likely to be transparent; it should also be understood that for purposes of the instant invention, the electrodes 34 and 38 may include such an opaque bus-grid pattern over significant portions thereof while still being regarded as "substantially transparent".

In operation, light enters the optical filter 30 through either the substrate or electrode side thereof. At least portions of selected wavelengths of the solar spectrum are absorbed by the body of photovoltaic material 36 and converted to electrical power which is collected by the electrodes 34 and 38. The nonabsorbed light passes through the filter, having had portions of harmful and/or undesirable wavelengths removed or attenuated. The electrical current thus generated is collected by leads (not shown) attached to the electrode layers 34 and 38. As discussed previously, a wide variety of semiconductor materials may be employed in the fabrication of the photovoltaic body 36, such as silicon alloy materials, germanium alloy materials, silicon germanium alloy materials, cadmium sulfide, cadmium telluride, copper indium diselenide, gallium arsenide and the like. Through the judicious selection of the semiconductor alloy material and the electrode material, and through the judicious control of the relative thicknesses of those materials, the quantity and quality of light absorption may be reliably and reproducably controlled so as to provide desired optical filtering properties. Additionally, and as will be described in greater detail hereinbelow, additional filtering layers may be included in the filter of the instant invention to further modify the optical absorption and transmission thereof. For example, one or more layers adapted to either reflect or absorb infra-end radiation may be employed to prevent passage of infra-end through the filter.

EXAMPLE I

Figure 3B:
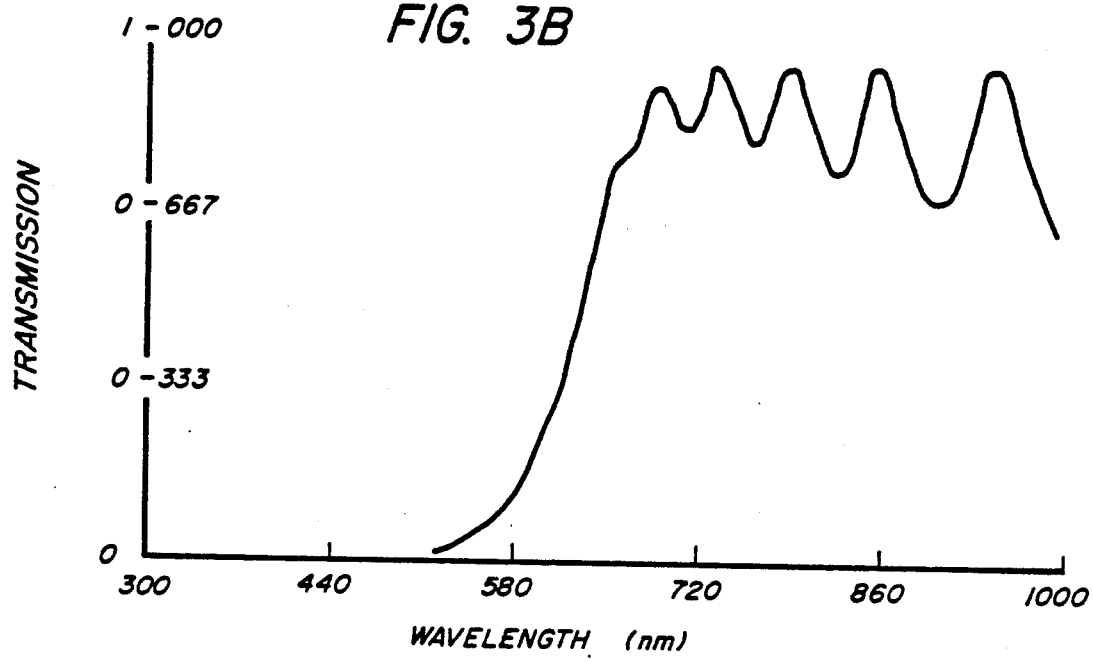
FIG. 3B is a plot of the transmission of specific wavelengths of the incident solar spectrum through an optical filter which has been structurally designed in the manner depicted in FIG. 3A.
Figure 3C:
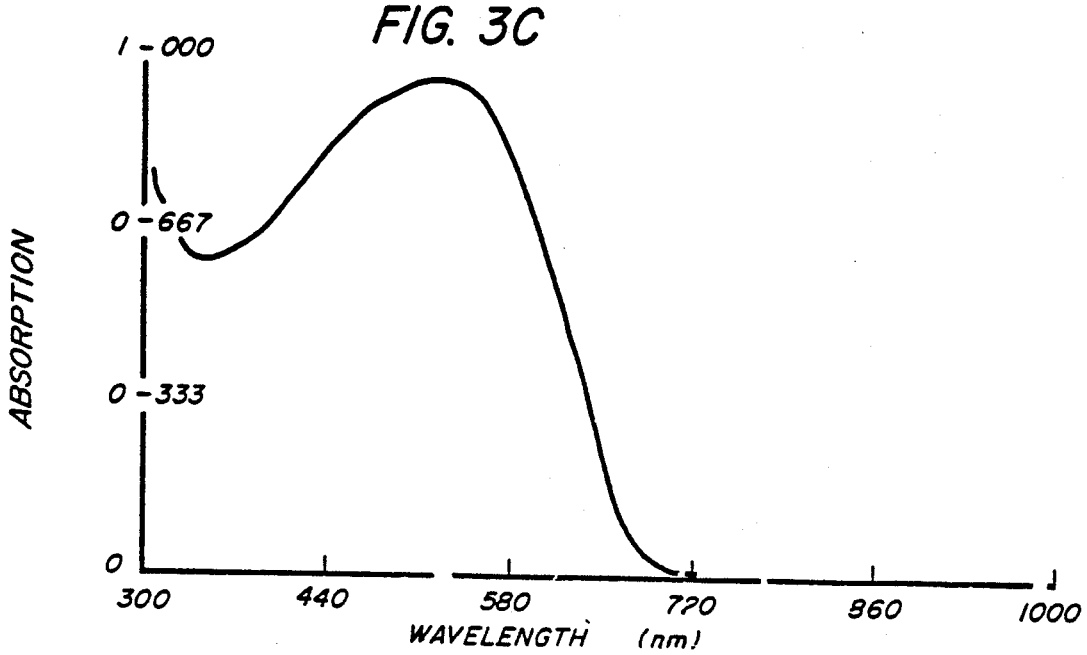
FIG. 3C is a plot of the absorbtion of specific wavelengths of the incident solar spectrum by an optical filter which has been structurally designed in the manner depicted in FIG. 3A.

Referring now to FIGS. 3B and 3C, there is shown a graphic representation of the transmission and absorption characteristics of one embodiment of a power generating optical filter fabricated pursuant to the principles of the instant invention, said filter configured similarly to that illustrated in and described with respect to FIG. 3A. The filter is comprised of an optically clear, transparent glass substrate (the thickness thereof being irrelevant), and a 1000 Angstrom thick amorphous silicon photovoltaic body formed of an approximately 800 Angstrom thick layer of substantially intrinsic amorphous silicon:hydrogen:fluorine alloy material having a band gap 1.7 eV, sandwiched between p and n doped layers of silicon:hydrogen:fluorine alloy material of approximately 100 Angstroms thickness each. Disposed on opposite sides of the photovoltaic body, and in electrical communication with the p doped and n doped layers thereof are two indium tin oxide electrodes, each 750 Angstroms in thickness. The thickness of the electrodes was selected so as to (1) provide sufficient electrical conductivity to withdraw power generated by the photovoltaic body 36 and (2) establish an anti-reflective condition for at least a portion of wavelengths of light in the red region of the solar spectrum so as to maximize transmission through the optical filter.

The absorption and transmission of the thus constructed power generating optical filter was calculated using known optical data (such as refractive index, transmissivity, coefficient of absorbtion) for the indium tin oxide and the silicon alloy material, utilizing well known optical techniques as applied through a computer simulation program. The data therefrom, including transmission and absorbtion characteristics taken at 10 nanometer intervals, is graphically represented in FIG. 3B and FIG. 3C.

Referring now specifically to FIG. 3B, there is shown a graphic representation of light transmission of the optical filter as a function of the wavelength of light. It may be seen that at wavelengths of approximately 500 nanometers and lower the optical filter is completely opaque and no light is transmitted therethrough. Starting at approximately 520 nanometers, the filter 30 shows a steadily increasing transmission of the incident radiation and rapidly attains a maximum at approximately 680 nanometers. The filter exhibits a slight periodic variation in transmission for the red and near infared wavelengths in the region of 680 to 1000 nanometers, this variation being attributable to interference effects arising from the interaction of the relatively long wavelength photons with the thin layer. The optical filter charracterized in FIG. 3B presents a golden yellow color to the human eye when viewed under solar illumination and attenuates approximately half of the total light incident thereupon.

FIG. 3C is a computation of the absorption of that same optical filter constructed in the manner described with reference to FIG. 3A over the same range of wavelengths; it may be noted that the data for absorption and transmission do not add up to unity. This discrepancy is attributable to the fact that a portion of incident light is reflected from the surface of the filter; the light transmitted through the filter being equal to the light reflected and the light absorbed by the filter. It will be noted that the absorption characteristics of the aforedescribed filter exhibit a very steep increase over the range of approximately 680 to approximately 500.

nanometers, this increase in absorption corresponding to the filter's corresponding transmission characteristics. What is especially noteworthy, is the fact that the absorption depicted in FIG. 3C eliminates damaging violet and ultraviolet wavelengths and also corresponds and is attributable to the photoresponsive spectrum of the photovoltaic body and the electrodes. Therefore, this absorption is advantageously utilized by the filter to produce electrical power.

It should be further noted that the absorption and transmission characteristics of a power generating optical filter such as that graphically depicted with reference to FIGS. 3B and 3C may be altered by varying the band gap of the photovoltaic and electrode material, so as to shift the wavelength range in which the filter changes from transmissive to absorbing. For example, silicon:carbon alloy materials and silicon nitrogen alloy materials, either with or without hydrogen and fluorine, have band gaps which are greater than that of corresponding silicon alloys.

EXAMPLE II

Figure 3D:
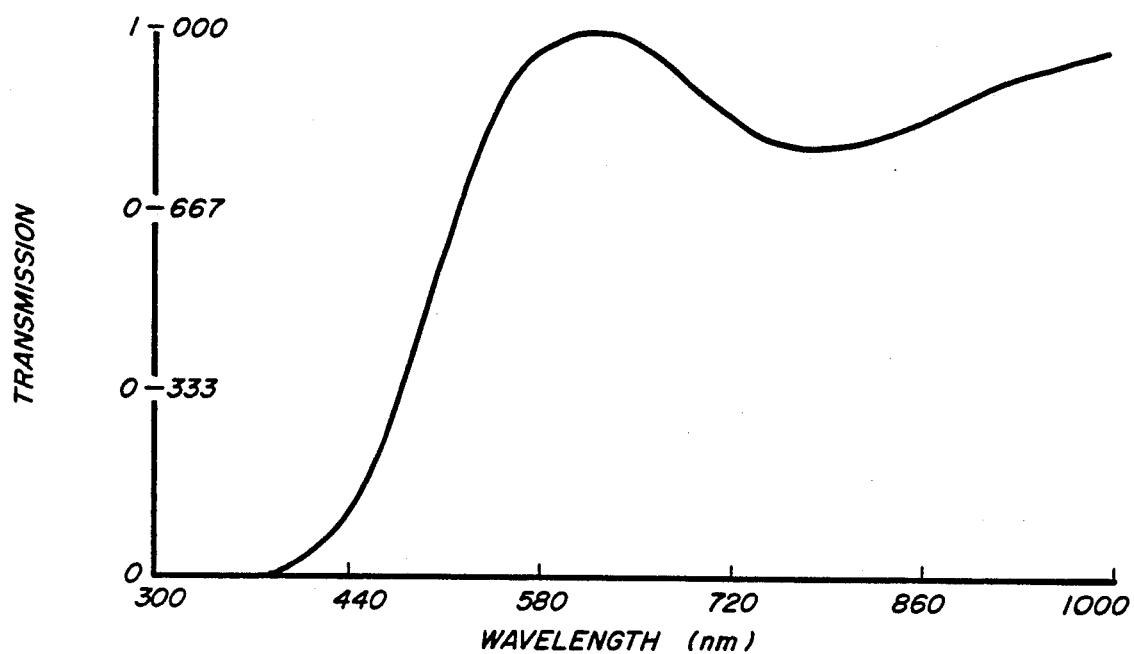
FIG. 3D is a plot of the transmission of specific wavelengths of the incident solar spectrum through an optical filter which has been structurally designed in the manner depicted in FIG. 3A, and including a 2.0 eV photovoltaic body.
Figure 3E:
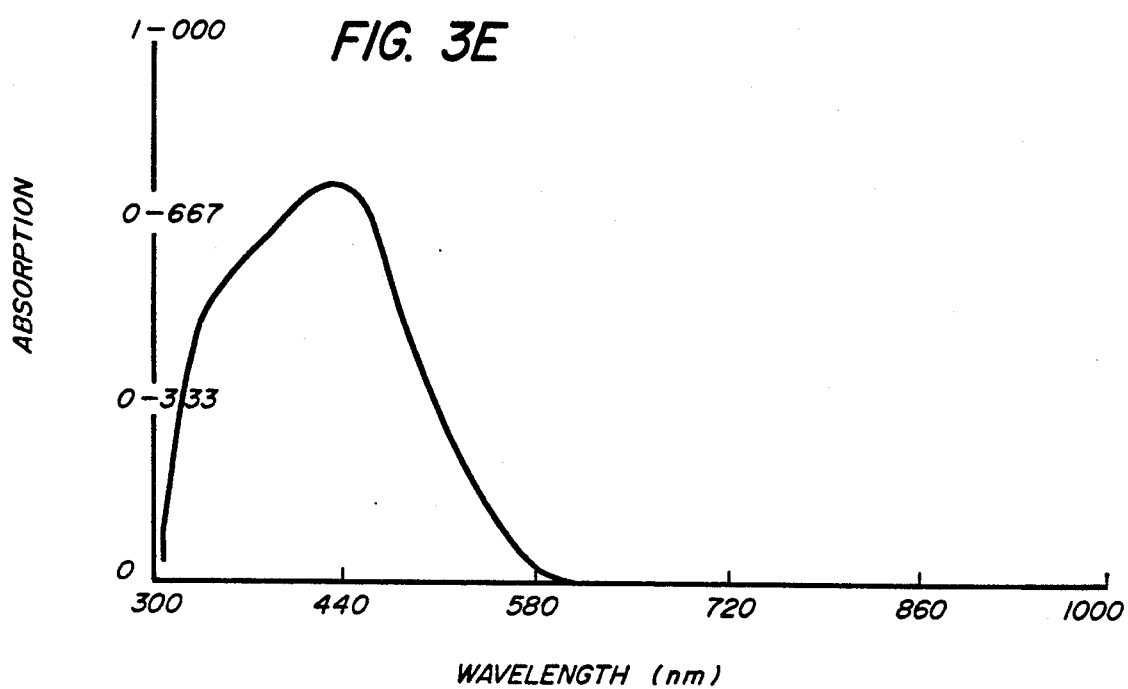
FIG. 3E is a plot of the absorption of specific wavelengths of the incident solar spectrum by an optical filter which has been structurally designed in the manner depicted in FIG. 3A, and including a 2.0 eV photovoltaic body.

Referring now to FIGS. 3D and 3E, there is shown transmission and absorption characteristics for a power generating filter generally similar to the filter 30 of FIG. 3A, but formed to include an 800 Angstrom thick intrinsic semiconductor alloy layer of substantially intrinsic amorphous silicon:carbon:hydrogen:fluorine alloy material having a band gap of approximately 2.0 eV. It will be noted from FIG. 3D that the filter which includes the 2.0 eV material is more transmissive of shorter wavelengths, than is the corresponding filter made from 1.75 eV alloy material. Referring specifically to FIG. 3D, it will be seen that at wavelengths of approximately 400 nanometers and lower, the filter is completely opaque and no light is transmitted therethrough. Starting at approximately 440 nanometers, the filter shows a steadily increasing transmission, and rapidly attains a maximum at 580 nanometers. It should be noted that by the use of the appropriate infra-red reflecting or absorbing layers, this filter may be rendered non-transmissive of infra-red radiation. The filter of the example presents a pale yellow tint when viewed by the human eye.

FIG. 3E is a graphic representation of the light absorption of the filter of this example, including the 2.0 eV material. It will be noted that the filter exhibits a maximum absorption for the violet and ultraviolet wavelengths and thus effectively excludes these damaging portions of the solar spectrum.

Furthermore, in addition to varying the band gap it should be noted that by varying the thickness of the photovoltaic body, the magnitude of its absorption may be varied. Additionally, by changing the thickness and-/or refractive indicies of the component materials of the filter, particularly the electrode members, interference effects may be controlled to facilitate or prevent the passage of at least portions of particular wavelengths of incident radiation into the filter for the subsequent absorption or transmission thereof.

EXAMPLE III

Figure 4A:
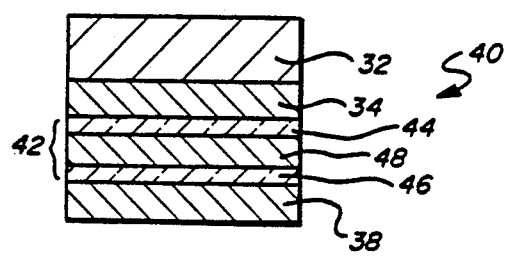
FIG. 4A is an enlarged, cross-sectional view of a second embodiment of the power generating optical filter of the instant invention, said filter formed of two photovoltaic bodies disposed between layers of transparent electrode material.

Referring now to FIG. 4A, another embodiment of a power generating optical filter 40 is shown structured in accord with the principles of the instant invention. The filter 40, includes elements generally similar to those described with reference to FIG. 3A. Accordingly, similar elements will be referred to by the same reference numeral. The power generating filter 40 includes a transparent substrate 32 generally similar to the substrate described previously with reference to filter 30. The filter 40 also includes a pair of substantially transparent electrodes 34 and 38, also as described in the foregoing example.

Where the filter 40 differs from the filter 30 is in the constitution of the photovoltaic body 42, itself. The photovoltaic body 42 of the FIG. 4A filter may be considered to be a split version of the photovoltaic body 36 of FIG. 3A, insofar as it is comprised of two sublayers of photoactive semiconductor material 44 and 46 separated by a relatively transparent layer 48 which is electrically conductive and operatively disposed in ohmic contact with both the first sublayer 44 and the second sublayer 46 of photovoltaic material. The entire assemblage of layers 44, 46 and 48 is adapted to produce a photovoltaic current in a manner similar to the photovoltaic body 34 of FIG. 3A and, accordingly, will be referred to as the photovoltaic body 42, although it is to be understood that the optically transparent layer 48 need not be (and indeed is not) photoactive in the sense of absorbing incident radiation energy and producing photons in response thereto.

As in the foregoing example, the sublayers 44 and 46 of the photovoltaic body 42 may be fabricated of various semiconductor materials disposed in various configurations such as n-i-p, p-i-n, p-n, Schottky barrier and m-i-s junctions, and the like. Furthermore, the two photovoltaic sublayers 44 and 46 may either be of similar or differing composition depending on the percentage and color of light desired to be transmitted through the filter. The optically transparent intermediate sublayer 48 is preferably designed to exhibit relatively high electrical conductivity and relatively low optical absorbtion so as to maximize the performance of the photovoltaic sublayers 44 and 46. To this end, material suitable for the fabrication of the electrode layers 34 and 38 may be similarly employed to fabricate the intermediate transparent, conductive layer 48.

By splitting the photoactive body 32 with a transparent intermediate layer such as 48, the optical absorbtion and transmission of the filter 40 may be effectively modified in a preselected manner. Optical materials may be made to exhibit phenomena of constructive and destructive interference when these materials are present in thicknesses which are chosen to form precise fractions or multiples of particular wavelengths of light. It is such phenomena which may be utilized to enhance or suppress the absorption and transmission characteristics of the filter in preselected portions of the spectrum. These principles may be illustrated with reference to the graphs of FIGS. 4B and 4C.

In this example, the light transmission and absorption of an optical filter configured according to the structure of FIG. 4A were calculated as in the foregoing example. The filter comprised a transparent substrate and two 750 angstrom thick indium tin oxide layers having sandwiched therebetween a photovoltaic body of the split configuration of FIG. 4A.

The photovoltaic body 42 comprised two amorphous silicon alloy p-i-n type solar cells 44 and 46 separated by a 750 angstrom thick layer of indium tin oxide. Each of the cells 44 and 46 was of 500 angstroms total thickness and comprised 400 angstroms of a substantially intrinsic amorphous silicon:hydrogen:fluorine alloy material sandwiched between 50 angstrom thick layers of p doped and n doped silicon:hydrogen:fluorine alloy material. It may thus be seen that the total thickness of the photoactive silicon alloy material of this example and of the photoactive silicon alloy material of Example I was the same. The only difference between the power generating optical filter of Example I and the power generating optical filter of instant example was the formation of a multilayered sandwich which included the layer of indium tin oxide material 48 between the two solar cells 44 and 46 of half thickness.

Figure 4B:
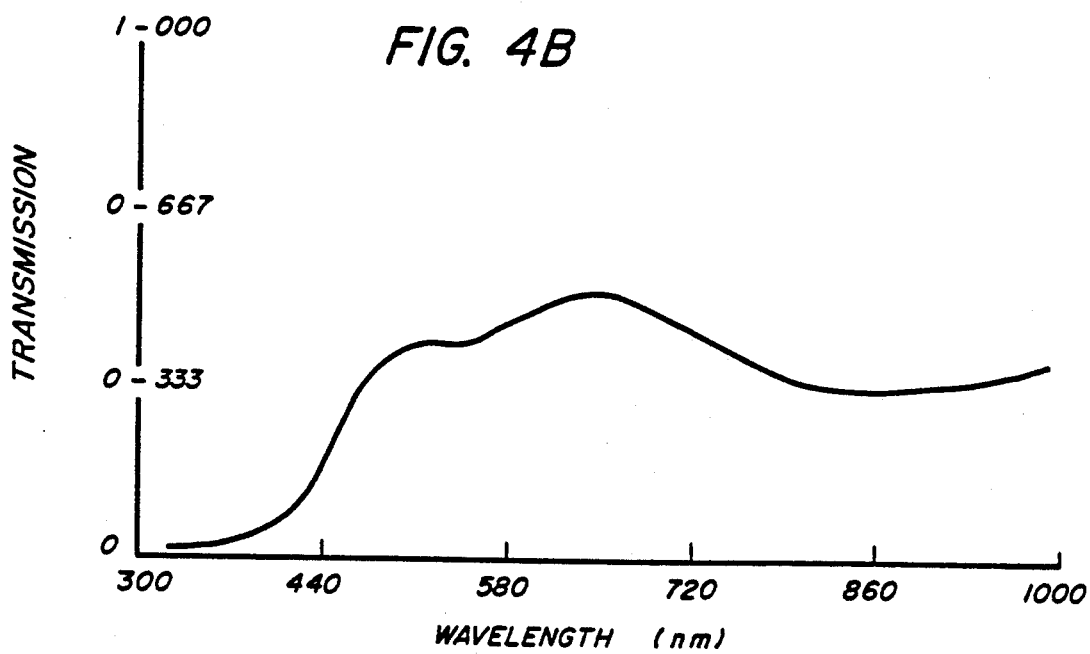
FIG. 4B is a plot of the transmission of specific wavelengths of the incident solar spectrum through an optical filter which has been structurally designed in the manner depicted in FIG. 4A.
Figure 4C:
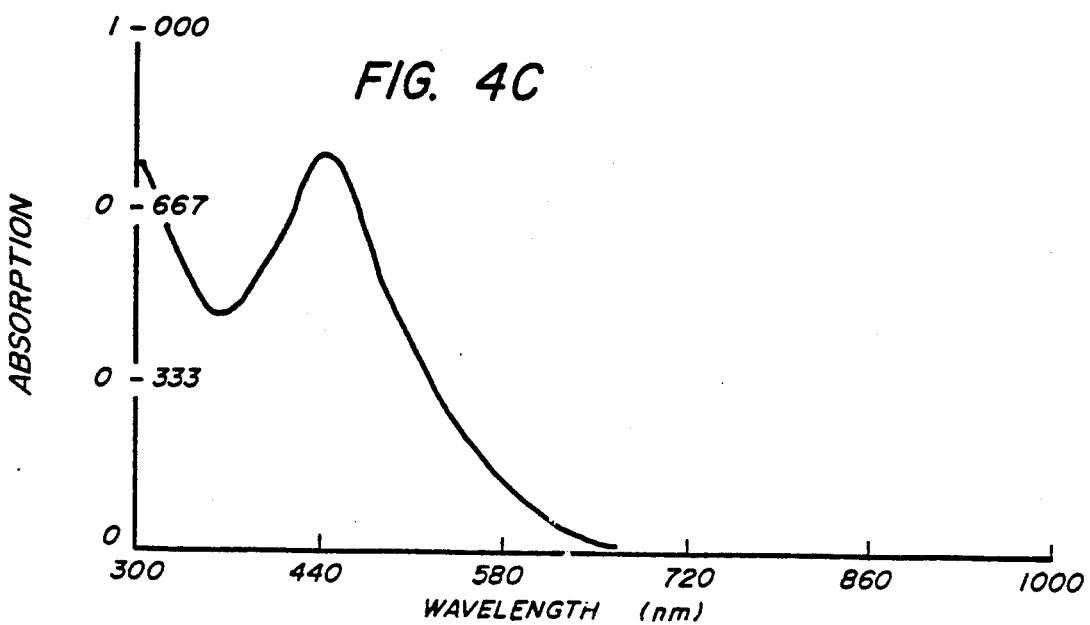
FIG. 4C is a plot of the absorbtion of specific wavelengths of the incident solar spectrum by an optical filter which has been structurally designed in the manner depicted in FIG. 4A.

Reference to FIGS. 4B and 4C will illustrate the dramatic change in optical properties attendant upon the inclusion of this type of multilayered sandwich. Referring first to FIG. 4B, there is illustrated a graph of transmission versus wavelength. It will be seen that while the overall optical transmission of the filter 40 is lower at longer wavelengths as compared to the optical transmission of the filter illustrated in the graph of FIG. 3B, the filter is still fairly transmissive at 500 nanometers while the FIG. 3B filter transmits no wavelengths of light below 525 nanometers. Furthermore it will be noted that the transmission of the filter of FIG. 44 is relatively flat throughout a major portion of the visible spectrum, i.e. substantially identical percentages of incident wavelengths of 500-1000 nanometer light are transmitted through the filter.

Referring now to FIG. 4C, it will be seen that the change in the absorption spectrum (as compared to the FIG. 3A filter) corresponds to that in the transmission spectrum. What, in the previous example, was a broad absorbtion centered about 570 nanometers (see FIG. 3C) has become a rather narrow, but intense absorbtion centered about approximately 460 nanometers. These changes result from the interposition of the transparent indium tin oxide layer 48 within the two thinner layers of absorbing semiconductor material 42 and 44 of the filter depicted in FIG. 4A and are attributable to the interaction of the thin layers with the incident wavelengths of light.

What is notable about the transmission and absorbtion spectra of the optical filter characterized to FIGS. 4B and 4C is the fact that the light transmitted thereto is of a relatively neutral tone as perceived by the human eye. This is in direct contradistinction to the golden yellow or pale yellow light transmitted through the filters described in the foregoing examples. While there are many instances where it is desirable to have colored light transmitted through an optical filter, there are many other applications that require a relatively neutral tone to be transmitted therethrough. While the filters of FIGS. 3A-3E and 4A-4C were shown as being transmissive of infra-red radiation, modification thereof may be made in accord with the principles of the instant invention to limit such transmission.

There are various technologies available which may be adapted to render the filters of the instant invention non-transmissive of infra-red radiation. A layer of infra-red absorbing dye may be incorporated into the filter thereby rendering it opaque to these wavelengths. Infra-red absorbing dyes become warm upon absorption of energy. In some instances this warming can be tolerated, but in other instances it will be desirable to prevent such heating.

In those instances where warming is to be avoided, the filter may include a heat mirror, which term as used herein is meant to define a layer of material adapted to reflect infra-red radiation, while transmitting visible wavelengths. There are a number of heat mirror materials known to those skilled in the art; among such materials are transparent conductive materials such as for example: tin oxide, zinc oxide, indium oxide, cadmium stannate and various combinations thereof, in other instances thin metallic films may be employed to reflect chosen infra-red wavelengths.

The filters of the instant invention can include an assemblage of layers operating upon principles of interference to reflect chosen infra-red wavelengths, while passing visible wavelengths. Such techniques, as well as other optical filtering techniques are well known to those skilled in the optical arts and may be readily adapted to render the power generating filters of the instant invention non-transmissive of infra-red wavelenghts as well as any other chosen wavelength. For example, the filters of the instant invention may include a layer or layers adapted to reject a portion of the visible spectrum for purposes of adjusting the color balance of light transmitted through the filter.

The phenomena of constructive and destructive interference in thin layers of optical material have been previously recognized and described by those skilled in the optical arts, and such ordinarily skilled routineers are well versed in the calculation and prediction of a variety of such phenomena. However, such effects have not heretofore been synergistically described or employed in conjunction with thin photovoltaic layers of given characteristics optical absorbtion coefficients for the purpose of modifying the absorbtion and transmission signature of bulk layers of the identical material. Furthermore, there has heretofore been no use of such phenomena in conjunction with photovoltaic materials for purposes of providing a power generating optical filter having specifically turned or tailored light absorbtion and transmission characteristics. As should be apparent to one skilled in the art, the layer thicknesses, and/or bandgap and/or refractive indicies of the thin materials (photovoltaic and electrode) comprising the filter of the instant invention may be varied so as to change the transmission and absorbtion signatures of the filters. Therefore, it is to be understood that by judiciously selecting the number, thickness and materials from which the sublayers are fabricated, control of the optical properties of such power generating filters may be had.

EXAMPLE IV

In this example, a filter was constructed, generally similar to the filter 30 of FIG. 3A, except that the thicknesses of the transparent electrode layers was varied and an additional Magnesium Fluoride layer was added to vary the optical properties of the filter.

Figure 11A:
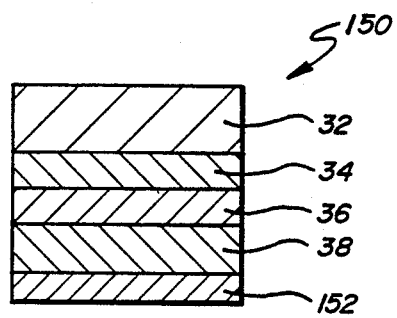
FIG. 11A is an enlarged, cross-sectional view of another power generating optical filter of the instant invention, including an optical tuning layer therein.

Referring now to FIG. 11A, there is shown a cross-sectional view of the filter 150 of this example. The filter 150 includes a substrate 32, generally similar to the substrate in previous examples. Disposed upon the substrate 32, is a first indium tin oxide electrode 34 of approximately 760 angstroms thickness, having disposed in electrical contact therewith a photovoltaic semiconductor body 36, formed of amorphous silicon:hydrogen:fluorine alloy material having a band gap of approximately 1.75 eV. The photovoltaic body 36, is approximately 540 angstroms thick and is comprised of a 400 angstrom thick layer of intrinsic material disposed between two oppositely doped layers of approximately 70 angstroms thickness each.

The filter further includes a second electrode layer 38 disposed in contact with the photovoltaic body 36. The second electrode layer 38 is an indium tin oxide layer of approximately 1300 angstroms thickness, and it has disposed upon the surface thereof, opposite the photovoltaic body 36, an optical tuning layer 152 of a relatively transparent material, such as in this instance, magnesium fluoride, of approximately 670 angstroms thickness, for purposes of further modifying the absorption of the filter.

The electrode layers 34, 38, the photovoltaic body 36, and the magnesium fluoride optical tuning layer 152 interact optically with incident light to provide a power generating filter having a relatively neutral absorption of light.

Figure 11B:
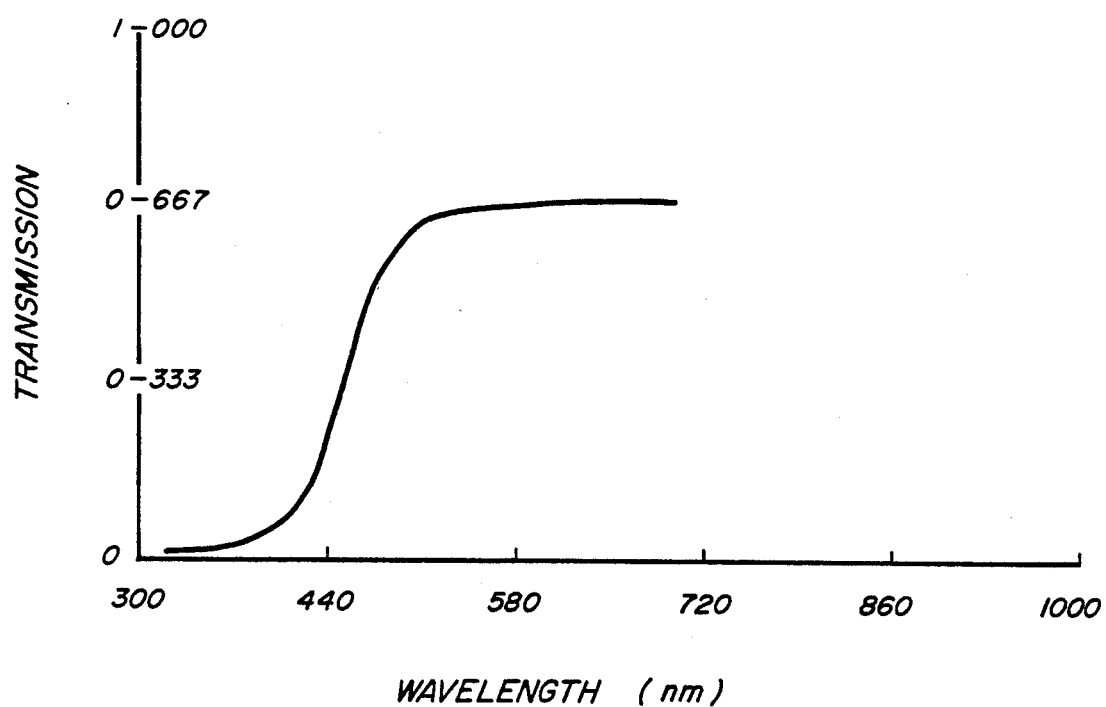
FIG. 11B is a plot of the transmission of specific wavelengths of the solar spectrum through an optical filter which has been structurally designed in the manner depicted in FIG. 11A.

Referring now to FIG. 11B, there is shown the transmission characteristics of the filter 150 of this example. It will be noted from the figure that the filter has a transmission of approximately 35% at 450 nanometers, 51% at 480 nanometers, 60% at 500 nanometers and approximately 65% at 660 nanometers.

It should be noted that other transparent materials such as calcium fluoride, silicon dioxide and the like of the appropriate thickness may be used to similarly modify or tune the optical properties of the filter, in accord with well known optical principles.

Figure 5:
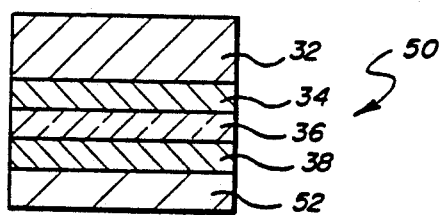
FIG. 5 is an enlarged, cross-sectional view of the optical filter depicted in FIG. 3A with an encapsulating layer operatively disposed to protect the second electrode.

While the power generating filters of the instant invention have been described with reference to FIG. 3A and 4A as not including an encapsulating or protective layer upon the exposed surface thereof, in practicality, the inclusion of such a layer would often be desirable for the purpose of protecting the thin film layers of the filter from ambient conditions. Referring now to FIG. 5, there is shown yet another power generating optical filter, generally 50, structured in accord with the principles of the instant invention. This filter 50 is generally similar to the filter described with reference to FIG. 3A, including a transparent substrate 32 and a pair of substantially transparent electrodes 34 and 38 with a body of photovoltaic material 36 disposed therebetween.

Where the filter 50 differs from those previously described is in the inclusion of a protective encapsulating layer 52 upon the exposed surface of the second electrode 38. The function of the encapsulating layer 52 is to protect the underlying thin film layers from the deleterious effects of the atmosphere while allowing the relatively unimpeded transmission of light therethrough. There are a wide variety of materials which are particularly adapted to form an encapsulating layer. Among such materials are any one of a large number of glasses such as borosilicate glasses, silicate glasses and so forth. Similarly synthetic polymeric resins such as polycarbonates, acetates, polyimides and polyesters may be employed, as may other organic materials including adhesives such as epoxies and the like. Wide bandgap semiconductor or insulating materials are highly transparent and durable and may be ideally utilized to form an encapsulating layer.

It should be noted at this point that, while the encapsulating layer 52 and the substrate 32 are both described as being transparent, in some instances it may be desirable or acceptable to utilize materials having some degree of optical absorption for the fabrication of these members. While the use of an encapsulant characterized by an appreciable degree of light absorption might normally be considered a detriment to power generation in the filter or transmission of desirable wavelengths; in those instances where it absorbs light which is already completely absorbed by the overlying layers of the filter, its presence will not have any effect provided the filter is illuminated from the side opposite the encapsulant In other instances, colored (i.e., absorbing or reflecting) encapsulants or substrates may be used to modify the optical properties of the filter still further; for example, the infra-red rejecting layer mentioned previously may be incorporated into the encapsulating layer.

Figure 6:
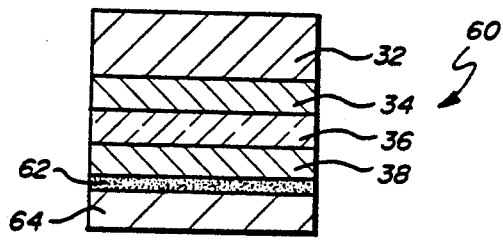
FIG. 6 is an enlarged, cross-sectional view of the optical filter depicted in FIG. 5 with an adhesive disposed between the transparent electrode and the encapsulating layer.

FIG. 6 illustrates still another power generating optical filter 60 structured in accord with the principles of the instant invention. As in the foregoing example, the filter 60 includes a substrate 32, a pair of electrodes 34 and 38 and a photovoltaic semiconductor body 36 disposed therebetween. The power generating optical filter 60 of FIG. 6 also includes an encapsulating layer comprised of a layer of adhesive material 62 which is adapted to affix a durable protective sheet 64 to the exposed surface of the second electrode. As should be apparent, both the adhesive 62 and the protective member 64 should generally be relatively transparent to solar radiation.

The particular embodiment of FIG. 6 is ideally suited for the fabrication of the so called "laminated safety glass" type of materials in which two sheets of glass are affixed by a protective, adhesive layer. For example, in the filter 60, the substrate 32 and the protective member 64 may both be formed of glass and may be affixed together by a relatively tough, flexible transparent adhesive polymeric material 62 so as to provide a filter 60 which is resistant to shattering and which retains integrity upon breakage.

A filter formed in such a manner would be ideally suited for use in the manufacture of automobile windows insofar as the optical transmission and absorption thereof may be selected in according to the manner and the principles enunciated previously so as to provide a desirable tint to the windshield. Additionally, the power generated by the photovoltaic body thereof may be employed in the automobile for purposes of battery charging or the operation of accessories. For example, it would be highly desirable to have a power source which would not deplete charge stored in an automobile's battery, for operating a ventilating fan to maintain airflow therethrough when the vehicle is parked. If automobiles were manufactured utilizing such glazing materials, electrical power would be available whenever the vehicle was exposed to ambient sunshine.

It should be noted at this point, that one particular problem with safety glass, or other encapsulated glass which includes organic laminating materials therein, results from the previously described light induced degradation of such materials. Many of the polymers used to laminate or encapsulate glass are yellowed by ultra-violet radiation. It should now be readily apparent that by tailoring the photovoltaic body and the electrodes to absorb or reflect ultra-violet wavelengths and by disposing the photovoltaic body and electrodes between the damageable encapsulating or laminating layer and the light incident surface of the substrate, that damageable layer would be protected from degradation by ultra-violet radiation.

Figure 7:
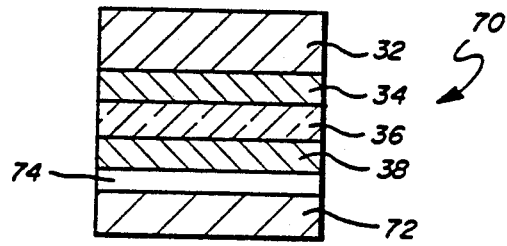
FIG. 7 is an enlarged, cross-sectional view of the optical filter depicted in FIG. 5 with an air gap disposed between the transparent electrode and the encapsulating layer.

Referring now to FIG. 7, there is shown still another embodiment of an optical filter 70 structured in accord with the principles of the instant invention. The filter 70 of FIG. 7 includes a substrate 32, electrodes 34 and 38 and a photovoltaic body 36 as previously described. The filter 70 also includes a protective transparent encapsulating layer 72 spacedly positioned proximate the exposed surface of the second electrode 38 so as to create a gap 74 therebetween. This gap 74, may be filled with air, nitrogen, argon or any other such gas, or it may be substantially devoid of material. The optical filter 70 thus configured, is a relatively good insulating member since the gap 74 limits the flow of thermal energy thereacross.

Such a power generating filter 70 is ideally suited for use as an architectural glazing panel. The optical filtering effect can be optimized so as to prevent passage of infra-red and ultra-violet rays into the building, the gap 74 provides insulation to prevent further heat gain or loss and the optical transmission characteristics of the filter may be otherwise modified if desired, to give an aesthetically pleasing tint to the light passing therethrough. Power generated by such a building panel can obviously be productively utilized by the inhabitants of the building.

The foregoing are intended to be representative of some possible configurations for the power generating optical filters structured in accord with the present invention. The particular filters which are illustrated in the drawings and described hereinabove, are meant to be merely illustrative of the principles of the instant invention; many other variations should be obvious to one of skill in the art. For example, any one of the encapsulated filters may be readily made to include a busgrid pattern therein. Similarly, the concept of utilizing the multiple layers of thin film electrode and semiconductor may be extended to all of the aforedescribed configurations. And, while the examples and calculations were based upon the use of amorphous silicon alloy photovoltaic bodies, the same principles would apply to photovoltaic bodies of amorphous germanium as well as polycrystalline silicon and germanium, chalcogenide based materials, cadmium based materials, and copper and indium containing materials.

As previously discussed, there exist a wide variety of applications for utilizing optical filters and there also exists a great need for electrical power. Consequently, the principles of the instant invention may be specifically adapted for a wide variety of uses. A few of the many uses possible for the power generating optical filter of the instant invention are illustrated hereinbelow.

Figure 8:
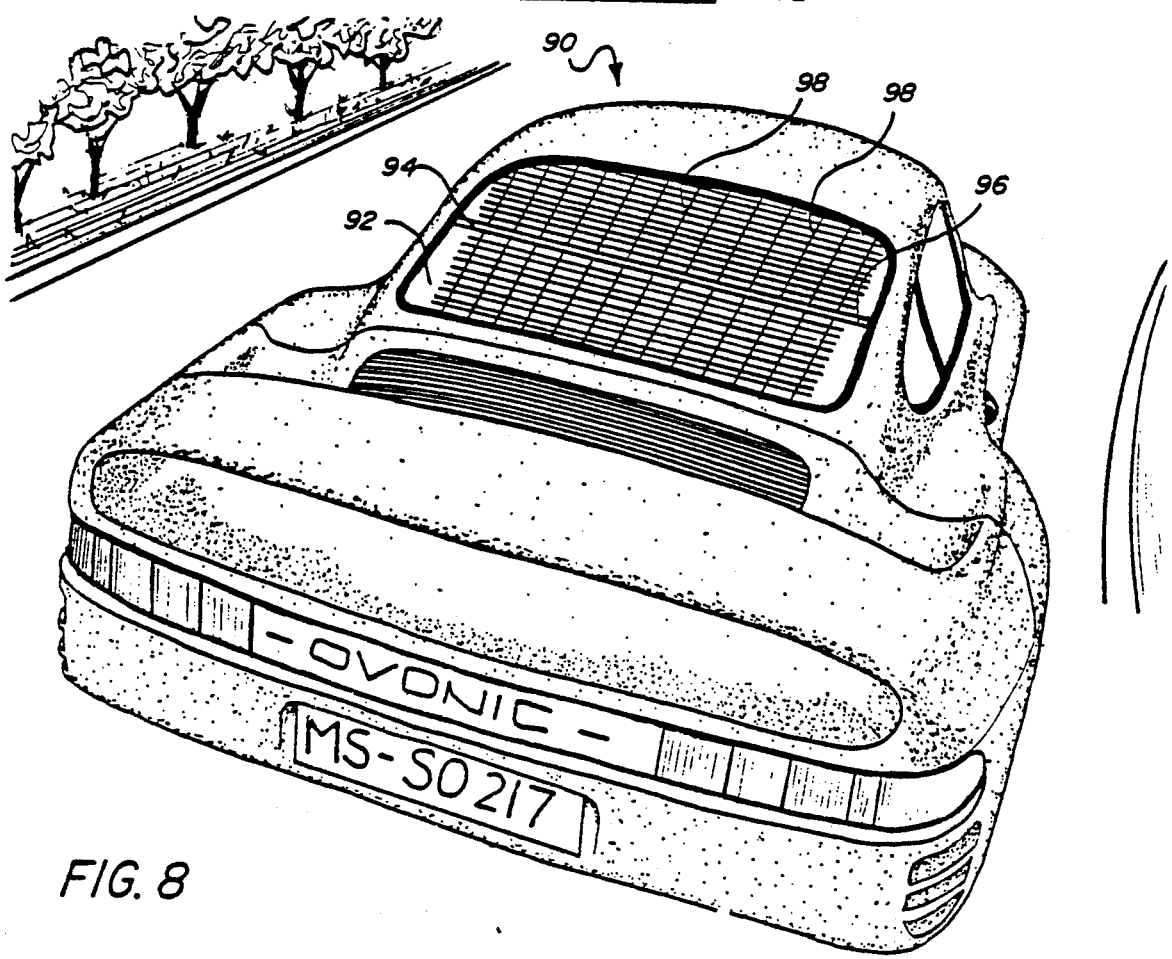
FIG. 8 is a stylized perspective view of an automobile illustrating the power generating optical filter of the instant invention operatively disposed on the rear windshield thereof.

Referring first to FIG. 8, there is shown an automobile 90 including therein a rear windshield 92 fabricated from the power generating optical filter material of the instant invention. The windshield 92 incorporating the filter is operatively disposed so as to filter ambient light entering the automobile 90 and to generate electrical power to supplement the battery and generator (or alternator) thereof. As illustrated, the power generating filter incorporated in the windshield 92 includes a bus grid pattern 94 for withdrawing electrical current generated by the photovoltaic body 36 thereof. The bus grid pattern 94 includes a major busbar 96 extending across the windshield and forming one major terminal for the extraction of power from the photovoltaic body of the filter. The busgrid pattern also has associated therewith a plurality of grid-fingers 98 for carrying photogenerated current from various portions of the photovoltaic body to the major busbar 96. In some embodiments, one busgrid pattern will be sufficient to withdraw current from the filter. However, in other instances it might be desirable to have a busgrid pattern associated with each of the two electrodes: all such modifications are within the skill of the routineer in the art and are included within the scope of the instant invention.

Use of power generating optical filters such as those of the instant invention which include electrically conductive layers has yet another advantage particularly applicable to automotive applications. External electrical current may be supplied through the conductive layers, such as 34 and 38 of filter 30, to all or a portion of the filter so as to cause resistive heating thereof for warming the substrate 32. Such heating is greatly beneficial in automotive applications for purposes of defogging and deicing the windshield.

An electrical current may be applied to the first electrode 38 so as to cause a flow through the photovoltaic body 36 to the second electrode 34, thereby effecting a warming of the substrate 32; alternatively, electrical current may be flowed transversely through only one of the conductive electrodes 34, thereby bypassing current flow through the photovoltaic body 36 while still warming the substrate 32. Alternatively, the busgrid pattern, 94 in FIG. 9, may be employed as a resistive heater by applying electrical current thereto.

While the automotive application depicted with reference to FIG. 8 shows a rear windshield 92, the entirety of which is a power generating optical filter, the instant invention is not so limited. For example, the power generating filter material of the instant invention may be provided only upon a portion of the windshield, as a light filtering strip operatively disposed only along the upper quarter or only disposed about the edges of the windshield.

Figure 9:
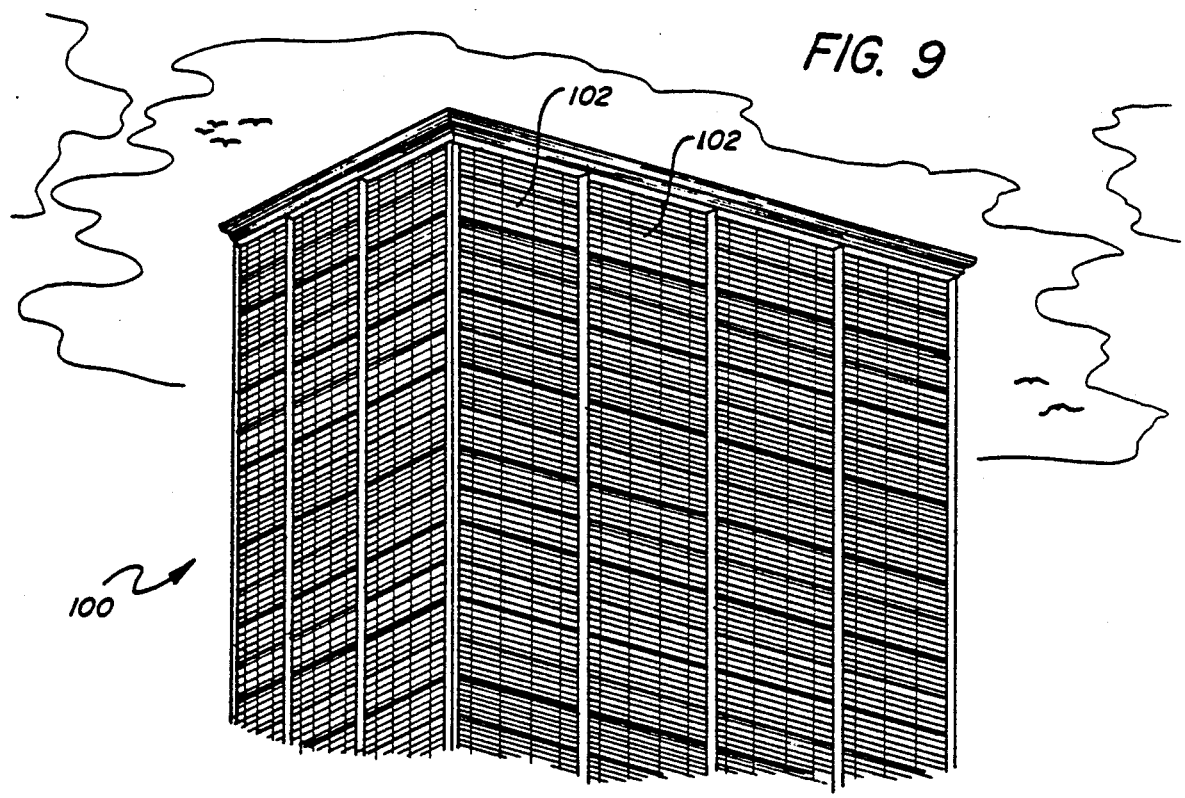
FIG. 9 is a stylized, fragmentary perspective view of a high-rise building illustrating the power generating optical filter of the instant invention operatively disposed on the architectural glass surfaces thereof.

Turning to FIG. 9, there is shown a portion of a high-rise building 100 having architectural glass panels 102 therein fabricated from the power generating optical filter material of the instant invention. High-rise buildings typically include large areas of tinted, or otherwise optically treated, glass and thus are ideally suited for deployment of the instant invention. The architectural panels 102 of FIG. 9 may be fabricated in a manner generally similar to the filter 70 described with reference to FIG. 7 herein and thus are specifically designed to simultaneously provide thermal insulation, light screening and electrical power to the building. As in the automotive application described hereinabove, the power generating optical filter 70 may include a busgrid pattern therein to aid in current collection; additionally, the filters may have an external current applied thereto to effect heating for purposes of defogging and deicing.

Figure 10:
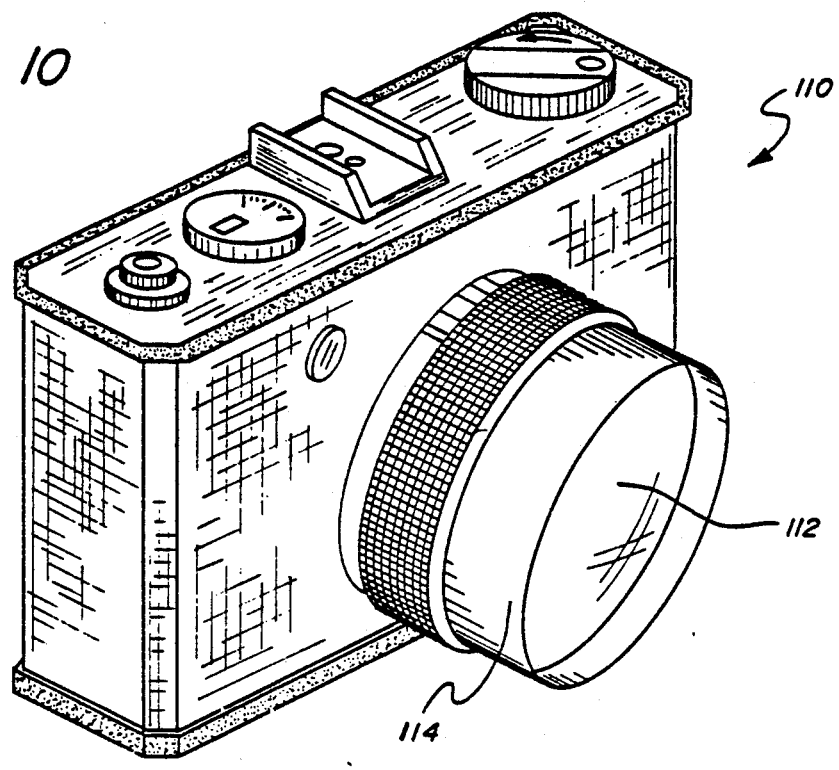
FIG. 10 is a stylized, perspective view of a camera illustrating the power generating optical filter of the instant invention operatively disposed on the lens thereof.

Referring now to FIG. 10, there is a shown a photographic camera 110 having a filter 112 affixed to the lens housing 114 thereof. In accord with the principles of the instant invention, this lens filter 112 may be a power generating optical filter. Since present photographic cameras employ a wide variety of electronic circuitry therein for control of aperture and shutter speed, the power generating optical filter of the instant invention may be employed to provide electricity to that circuitry in addition to providing a filtering effect for purposes of color balancing, ultra-violet blocking and so forth. It is contemplated that such a power generating optical filter would be provided with integral terminal contacts thereupon for electrically conductive engagement with corresponding contacts on the lens housing 114 so as to deliver power to the electrical circuitry of the camera.

The foregoing illustrates several embodiments and applications illustrative of the instant invention. Many other configurations of the power generating optical filter of the instant invention should be apparent to those skilled in the art. For example, the filters of the instant invention may be employed as windshields for wide variety of land, water, air and space vehicles.

The foregoing examples, drawings and descriptions are illustrative of some embodiments of the instant inventin and are not meant to be limitations upon the practice thereof. Rather it is the following claims, including all equivalents which are meant to define the scope of the invention.

What is claimed is:

1. A power generating optical filter including a transparent substrate; a first substantially transparent electrode disposed atop at least a portion of the substrate; a body of photovoltaic material adapted to generate electron hole pairs in response to the absorption of incident radiation, said body disposed atop at least a portion of the first electrode; and a second substantially transparent electrode disposed atop at least a portion of the body of photovoltaic material; the first and second electrodes and the body of photovoltaic material each fabricated to preselected thicknesses and from materials characterized by preselected indices of refraction for cooperatively establishing optical interference effects, whereby said filter transmits at least a portion of selected wavelengths of radiation incident thereupon substantially differing from wavelengths transmitted by that body of photovoltaic material alone; and optical tuning layer means for modifying the optical transmission of the filter.

2. A filter as in claim 1, wherein said optical tuning layer is fabricated from a material selected from the group consisting of magnesium fluoride, calcium fluoride, and silicon dioxide.

3. A filter as in claim 1, wherein said optical tuning layer is operatively disposed on said second transparent electrode.

4. A filter as in claim 1, wherein first and second electrodes are formed of a material selected from the group consisting of indium oxide, tin oxide, indium tin oxide, zinc oxide, and cadmium stanate.

5. A filter as in claim 1, wherein said photovoltaic body includes at least one layer of a silicon alloy material.

6. A filter as in claim 1, where said photovoltaic body includes at least one triad of layers, said triad comprising two layers of oppositively doped semiconductor alloy material having said layer of substantially intrinsic semiconductor alloy material interposed therebetween.

7. A filter as in claim 6, wherein said photovoltaic body includes a plurality of said triads of layers of semiconductor alloy material.

* * * * *